US012765292B2

(12) United States Patent
Ohuchida et al.

(10) Patent No.: US 12,765,292 B2
(45) Date of Patent: Oct. 13, 2026

(54) ETCHING METHOD AND PLASMA PROCESSING SYSTEM

(71) Applicant: Tokyo Electron Limited, Tokyo (JP)

(72) Inventors: Satoshi Ohuchida, Miyagi (JP); Masahito Yamaguchi, Miyagi (JP); Takatoshi Orui, Miyagi (JP); Maju Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 544 days.

(21) Appl. No.: 18/198,736

(22) Filed: May 17, 2023

(65) Prior Publication Data

US 2023/0377850 A1 Nov. 23, 2023

(30) Foreign Application Priority Data

May 19, 2022 (JP) ................................ 2022-082374
Apr. 18, 2023 (JP) ................................ 2023-067578

(51) Int. Cl.

*H10P 50/26* (2026.01)
*H10P 50/24* (2026.01)
*H10P 50/28* (2026.01)
*H10P 72/72* (2026.01)
*H01J 37/32* (2006.01)

(52) U.S. Cl.

CPC .......... *H10P 50/268* (2026.01); *H10P 50/242* (2026.01); *H10P 50/267* (2026.01); *H10P 50/283* (2026.01); *H10P 72/72* (2026.01); *H01J 37/32449* (2013.01); *H01J 2237/3341* (2013.01)

(58) Field of Classification Search

None
See application file for complete search history.

(56) References Cited

U.S. PATENT DOCUMENTS

| | | | | |
|---|---|---|---|---|
| 11,361,976 | B2 * | 6/2022 | Suda | H01L 21/3065 |
| 2016/0343580 | A1 | 11/2016 | Hudson | |
| 2021/0159089 | A1 * | 5/2021 | Suda | H01L 21/32137 |
| 2021/0343539 | A1 * | 11/2021 | Suda | H01J 37/32449 |
| 2022/0148884 | A1 * | 5/2022 | Orui | H01J 37/32724 |
| 2023/0402289 | A1 * | 12/2023 | Takahashi | H01L 21/32137 |

FOREIGN PATENT DOCUMENTS

| | | | |
|---|---|---|---|
| JP | 2016-039310 | A | 3/2016 |
| JP | 2022-002337 | A | 1/2022 |
| JP | 2022-020007 | A | 1/2022 |
| KR | 10-2021-0057061 | A | 5/2021 |

* cited by examiner

*Primary Examiner* — Duy Vu N Deo
*Assistant Examiner* — Andrew Keelan Laobak
(74) *Attorney, Agent, or Firm* — PROCOPIO, CORY, HARGREAVES & SAVITCH LLP

(57) ABSTRACT

The purpose of this disclosure is to provide an etching method. This method includes: (a) providing a substrate on a substrate support in a chamber, the substrate including a silicon-containing film and a mask on the silicon-containing film, the silicon-containing film including silicon and nitrogen; (b) supplying a process gas to the chamber, the process gas containing a hydrogen fluoride gas and a chlorine-containing gas, where a flow rate of the chlorine-containing gas is 1.5 volume % or more of a total flow of the process gas excluding an inert gas; and (c) generating a plasma from the process gas to etch the silicon-containing film.

15 Claims, 6 Drawing Sheets

ETCHING METHOD AND PLASMA PROCESSING SYSTEM

CROSS-REFERENCE TO RELATED APPLICATIONS

The present application claims priority under 35 U.S.C. § 119 to Japanese Patent Application No. 2022-82374 filed on May 19, 2022, and Japanese Patent Application No. 2023-67578 filed on Apr. 18, 2023, the entire contents of which are incorporated herein by reference.

BACKGROUND

Field

An exemplary embodiment of this disclosure relates to an etching method and a plasma processing system.

Description of Related Art

In US2016/0343580A and JP2016-039310A, techniques for etching a silicon-containing film are disclosed.

SUMMARY

In one exemplary embodiment of this disclosure, there is provided an etching method including: (a) providing a substrate on a substrate support in a chamber, the substrate including a silicon-containing film and a mask on the silicon-containing film, the silicon-containing film including silicon and nitrogen; (b) supplying a process gas to the chamber, the process gas containing a hydrogen fluoride gas and a chlorine-containing gas, where a flow rate of the chlorine-containing gas is 1.5 volume % or more of a total flow of the process gas excluding an inert gas; and (c) generating a plasma from the process gas to etch the silicon-containing film.

DETAILED DESCRIPTION

Figure 1:
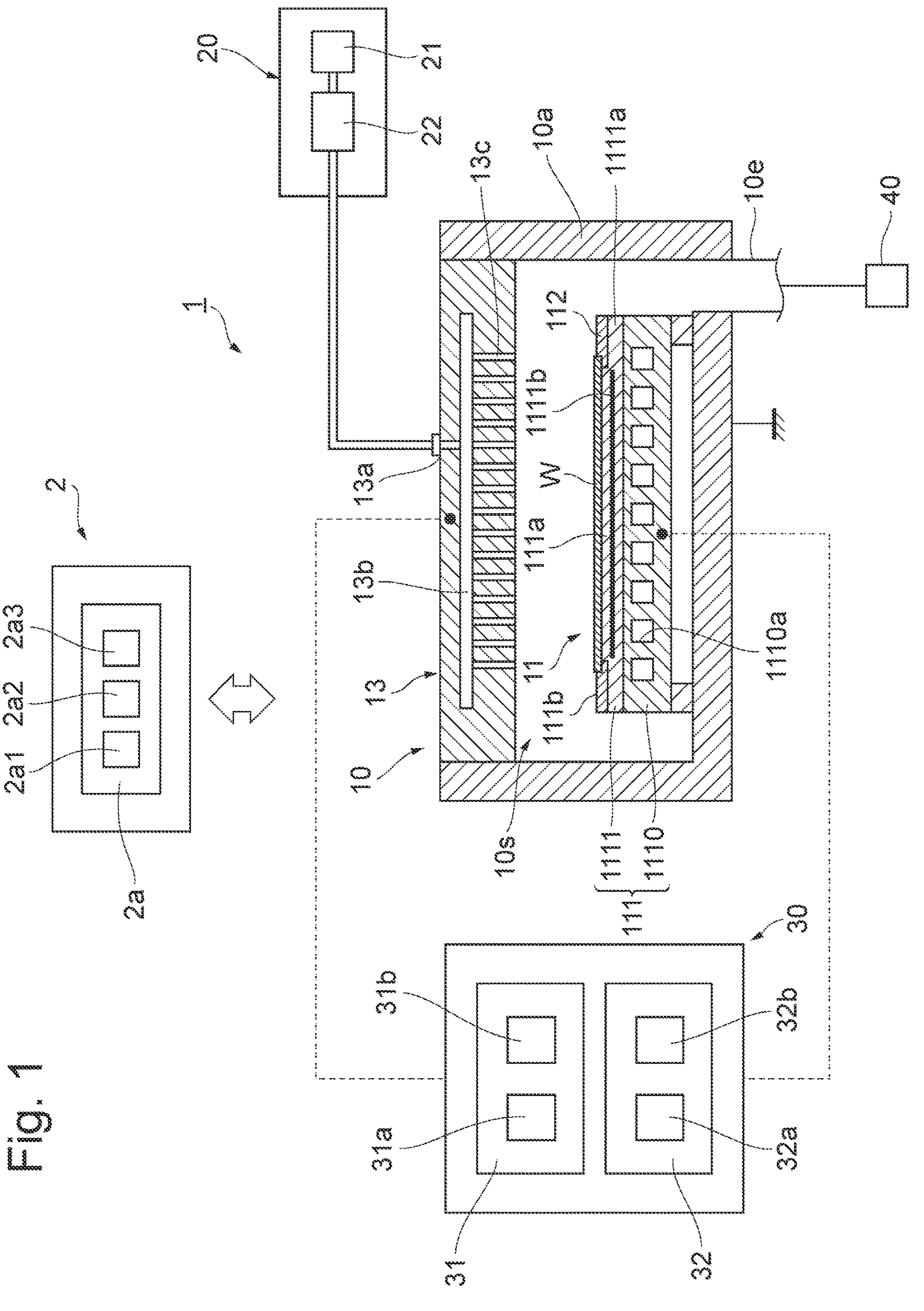
FIG. 1 is a diagram schematically illustrating an exemplary plasma processing system.

Each embodiment of this disclosure will be described below.

In one exemplary embodiment, there is provided an etching method including: (a) providing a substrate on a substrate support in a chamber, the substrate including a silicon-containing film and a mask on the silicon-containing film, the silicon-containing film including silicon and nitrogen; (b) supplying a process gas to the chamber, the process gas containing a hydrogen fluoride gas and a chlorine-containing gas, where a flow rate of the chlorine-containing gas is 1.5 volume % or more of a total flow of the process gas excluding an inert gas; and (c) generating a plasma from the process gas to etch the silicon-containing film.

In one exemplary embodiment, the chlorine-containing gas contains a phosphorus chloride gas.

In one exemplary embodiment, the chlorine-containing gas contains at least one selected from the group consisting of a $PCl_3$ gas, a $PCl_5$ gas, and a $POCl_3$ gas.

In one exemplary embodiment, the chlorine-containing gas contains at least one selected from the group consisting of a $Cl_2$ gas, an HCl gas, a $SiCl_2$ gas, and a $BCl_3$ gas.

In one exemplary embodiment, the process gas further contains a phosphorus fluoride gas.

In one exemplary embodiment, the phosphorus fluoride gas is at least either one of a $PF_3$ gas and a $PF_5$ gas.

In one exemplary embodiment, the flow rate of the chlorine-containing gas is 5 volume % or less of the total flow of the process gas excluding the inert gas.

In one exemplary embodiment, the chlorine-containing gas contains carbon.

In one exemplary embodiment, the chlorine-containing gas contains a CxHyFzClw gas (where x and w are integers of one or more, and y and z are integers of zero or more).

In one exemplary embodiment, the process gas further contains a phosphorus-containing gas.

In one exemplary embodiment, the flow rate of the hydrogen fluoride gas is the highest in the process gas excluding the inert gas.

In one exemplary embodiment, the process gas further contains a carbon-containing gas.

In one exemplary embodiment, the carbon-containing gas is either a fluorocarbon gas or a hydrofluorocarbon gas.

In one exemplary embodiment, the process gas further contains at least any one of an oxygen-containing gas and a metal-containing gas.

In one exemplary embodiment, the silicon-containing film further contains at least any one of a silicon nitride film, a silicon oxide film, and a polysilicon film.

In one exemplary embodiment, the mask is a carbon-containing film or a metal-containing film.

In one exemplary embodiment, the temperature of the substrate support in (c) is set to 0° C. or less.

In one exemplary embodiment, there is provided an etching method including: (a) providing a substrate on a substrate support in a chamber, the substrate including a silicon-containing film and a mask on the silicon-containing film, the silicon-containing film including silicon and nitrogen; (b) supplying a process gas to the chamber, the process gas containing a single or mixed gas and a chlorine-containing gas, the single or mixed gas containing fluorine and hydrogen, where a flow rate of the chlorine-containing gas is 1.5 volume % or more of a total flow of the process gas excluding an inert gas; and (c) generating a plasma from the process gas to etch the silicon-containing film, where the plasma contains active species of hydrogen fluoride.

In one exemplary embodiment, the single or mixed gas is at least one selected from the group consisting of a hydrogen fluoride gas, a hydrofluorocarbon gas, and a mixed gas containing a fluorine-containing gas and a hydrogen-containing gas.

In one exemplary embodiment, there is provided a plasma processing system including a chamber, a substrate support disposed in the chamber, a plasm generator, and a controller, wherein the controller is configured to cause: (a) placing a substrate on the substrate support in the chamber, the substrate including a silicon-containing film and a mask on the silicon-containing film, the silicon-containing film including silicon and nitrogen; (b) supplying a process gas to the chamber, the process gas containing a hydrogen fluoride gas and a chlorine-containing gas, where a flow rate of the chlorine-containing gas is 1.5 volume % or more of a total flow of the process gas excluding an inert gas; and (c) generating a plasma from the process gas to etch the silicon-containing film.

Each embodiment of this disclosure will be described in detail below with reference to the accompanying drawings. Note that the same or similar elements in respective drawings are given the same reference numerals to omit redundant description. The positional relationship such as up, down, left, and right will be described based on the positional relationship illustrated in each drawing unless otherwise noted. The dimension ratio of the drawing is not intended to represent an actual ratio, and the actual ratio is not limited to the illustrated ratio.

<Configuration Example of Plasma Processing System>

A configuration example of a plasma processing system will be described below. FIG. 1 is a diagram for describing a configuration example of a capacitive coupling type plasma processing apparatus.

The plasma processing system includes a capacitive coupling type plasma processing apparatus 1 and a controller 2. The capacitive coupling type plasma processing apparatus 1 includes a plasma processing chamber 10, a gas supply 20, a power supply 30, and an exhaust system 40. Further, the plasma processing apparatus 1 includes a substrate support 11 and a gas introduction section. The gas introduction section is configured to introduce at least one of process gases into the plasma processing chamber 10. The gas introduction section includes a showerhead 13. The substrate support 11 is disposed in the plasma processing chamber 10. The showerhead 13 is disposed above the substrate support 11. In one embodiment, the showerhead 13 constitutes at least part of a ceiling of the plasma processing chamber 10. The plasma processing chamber 10 has a plasma processing space 10*s* defined by the showerhead 13, side walls 10*a* of the plasma processing chamber 10, and the substrate support 11. The plasma processing chamber 10 has at least one gas supply port for supplying at least one process gas into the plasma processing space 10*s*, and at least one gas exhaust port for exhausting the gas from the plasma processing space. The plasma processing chamber 10 is grounded. The showerhead 13 and the substrate support 11 are electrically insulated from the casing of the plasma processing chamber 10.

The substrate support 11 includes a main body 111 and a ring assembly 112. The main body 111 has a central region 111*a* for supporting a substrate W, and an annular region 111*b* for supporting the ring assembly 112. A wafer is an example of the substrate W. The annular region 111*b* of the main body 111 surrounds the central region 111*a* of the main body 111 in plan view. The substrate W is disposed on the central region 111*a* of the main body 111, and the ring assembly 112 is disposed on the annular region 111*b* of the main body 111 in a manner to surround the substrate W on the central region 111*a* of the main body 111. Therefore, the central region 111*a* is also called a substrate support surface for supporting the substrate W, and the annular region 111*b* is also called a ring support surface for supporting the ring assembly 112.

In one embodiment, the main body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has the central region 111*a*. In one embodiment, the ceramic member 1111*a* also has the annular region 111*b*. Note that any other member that surrounds the electrostatic chuck 1111 such as an annular electrostatic chuck or an annular insulating member may have the annular region 111*b*. In this case, the ring assembly 112 may be disposed on the annular electrostatic chuck or the annular insulating member, or disposed on both the electrostatic chuck 1111 and the annular insulating member. Further, at least one RF/DC electrode coupled to an RF (Radio Frequency) power supply 31 and/or a DC (Direct Current) power supply 32 to be described later may be disposed in the ceramic member 1111*a*. In this case, at least one RF/DC electrode functions as the lower electrode. When a bias RF signal and/or a DC signal is supplied to at least one RF/DC electrode to be described later, the RF/DC electrode is also called a bias electrode. Note that the conductive member of the base 1110 and at least one RF/DC electrode may also function as two or more lower electrodes. Further, the electrostatic electrode 1111*b* may function as the lower electrode. Therefore, the substrate support 11 includes at least one lower electrode.

The ring assembly 112 includes one or more annular members. In one embodiment, the one or more annular members include one or more edge rings and at least one covering. Each edge ring is formed from a conductive material or an insulating material, and the covering is formed from an insulating material.

Further, the substrate support 11 may include a temperature control module configured to adjust the temperature of at least one of the electrostatic chuck 1111, the ring assembly 112, and the substrate to a target temperature. The temperature control module may also include a heater, a heat transfer medium, and flow paths 1110*a*, or a combination thereof. A heat transfer fluid such as a brine or gas flows in the flow paths 1110*a*. In one embodiment, the flow paths 1110*a* are formed in the base 1110, and one or more heaters are disposed in the ceramic member 1111*a* of the electrostatic chuck 1111. Further, the substrate support 11 may include a heat transfer gas supply configured to supply a heat transfer gas into a gap between the back surface of the substrate W and the central region 111*a*.

The showerhead 13 is configured to introduce at least one process gas from the gas supply 20 into the plasma processing space 10*s*. The showerhead 13 has at least one gas supply port 13*a*, at least one gas diffusion chamber 13*b*, and plural gas introduction ports 13*c*. The process gas supplied to the gas supply port 13*a* passes through the gas diffusion chamber 13*b*, and is introduced from the plural gas introduction ports 13*c* into the plasma processing space 10*s*. Further, the showerhead 13 includes at least one upper electrode. Note that the gas introduction section may also include one or more side gas injectors (SGIs) attached to one or more openings formed through the side walls 10*a* in addition to the showerhead 13.

The gas supply 20 may also include at least one gas source 21 and at least one flow controller 22. In one embodiment, the gas supply 20 is configured to supply at least one process gas from each corresponding gas source 21 to the showerhead 13 through each corresponding flow controller 22. For example, each flow controller 22 may also include a mass flow controller or a pressure control type flow controller. Further, the gas supply 20 may include one or more flow modulation devices for modulating or pulsing the flow rate of at least one process gas.

The power supply 30 includes an RF power supply 31 coupled to the plasma processing chamber 10 through at least one impedance matching circuit. The RF power supply 31 is configured to supply at least one RF signal (RF power) to at least one lower electrode and/or at least one upper electrode. Thus, a plasma is formed from at least one process gas supplied to the plasma processing space 10*s*. Therefore, the RF power supply 31 can function as part of a plasma generator configured to generate the plasma from one or more process gases in the plasma processing chamber 10. Further, a bias potential is generated in the substrate W by supplying the bias RF signal to at least one lower electrode so that ion components in the formed plasma can be attracted to the substrate W.

In one embodiment, the RF power supply 31 includes a first RF generator 31*a* and a second RF generator 31*b*. The first RF generator 31*a* is configured to be coupled to at least one lower electrode and/or at least one upper electrode through at least one impedance matching circuit so as to generate a source RF signal (source RF power) for plasma generation. In one embodiment, the source RF signal has a frequency in a range of 10 MHz to 150 MHz. In one embodiment, the first RF generator 31*a* may also be configured to generate plural source RF signals having different frequencies. The generated one or more source RF signals are supplied to at least one lower electrode and/or at least one upper electrode.

The second RF generator 31*b* is configured to be coupled to at least one lower electrode through at least one impedance matching circuit so as to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency in a range of 100 kHz to 60 MHz. In one embodiment, the second RF generator 31*b* may also be configured to generate plural bias RF signals having different frequencies. The generated one or more bias RF signals are supplied to at least one lower electrode. Further, in various embodiments, at least one of the source RF signal and the bias RF signal may be pulsed.

Further, the power supply 30 may include a DC power supply 32 coupled to the plasma processing chamber 10. The DC power supply 32 includes a first DC generator 32*a* and a second DC generator 32*b*. In one embodiment, the first DC generator 32*a* is configured to be connected to at least one lower electrode so as to generate a first DC signal. The generated DC signal is applied to at least one lower electrode. In one embodiment, the second DC generator 32*b* is configured to be connected to at least one upper electrode so as to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulses may have a rectangular, trapezoidal, or triangular waveform, or a combination of these pulse waveforms. In one embodiment, a waveform generator for generating a sequence of voltage pulses from the DC signal is connected between the first DC generator 32*a* and at least one lower electrode. Therefore, the first DC generator 32*a* and the waveform generator constitute a voltage pulse generator. On the other hand, when the second DC generator 32*b* and the waveform generator constitute the voltage pulse generator, the voltage pulse generator is connected to at least one upper electrode. The voltage pulses may have a positive polarity or a negative polarity. Further, the sequence of voltage pulses may include one or more positive voltage pulses and one or more negative voltage pulses in one cycle. Note that the first and second DC generators 32*a* and 32*b* may also be provided in addition to the RF power supply 31, or the first DC generator 32*a* may be provided instead of the second RF generator 31*b*.

The exhaust system 40 can be connected, for example, to a gas exhaust port 10*e* provided at the bottom of the plasma processing chamber 10. The exhaust system 40 may also include a pressure regulating valve and a vacuum pump. Pressure in the plasma processing space 10*s* is regulated by the pressure regulating valve. The vacuum pump may include a turbomolecular pump or a dry pump, or a combination these pumps.

The controller 2 processes computer executable instructions that cause the plasma processing apparatus 1 to execute various processes to be described in this disclosure. The controller 2 can be configured to control each of elements of the plasma processing apparatus 1 in order to execute the various processes to be described here. In one embodiment, some or all of components of the controller 2 may be included in the plasma processing apparatus 1. The controller 2 may include a processor 2*a*1, a storage 2*a*2, and a communication interface 2*a*3. The controller 2 is, for example, realized by a computer 2*a*. The processor 2*a*1 can be configured to read a program from the storage 2*a*2, and execute the read program in order to perform various control actions. This program may be prestored in the storage 2*a*2, or may be acquired through a medium when required. The acquired program is stored in the storage 2*a*2, read by the processor 2*a*1 from the storage 2*a*2, and executed by the processor 2*a*1. The medium may be any of various storage media readable on the computer 2*a*, or may be a communication line connected to the communication interface 2*a*3. The processor 2*a*1 may be a CPU (Central Processing Unit). The storage 2*a*2 may include a RAM (Random Access Memory), a ROM (Read Only Memory), an HDD (Hard Disk Drive), an SSD (Solid State Drive), or a combination of these storage media. The communication interface 2*a*3 may communicate with the plasma processing apparatus 1 through a communication line such as LAN (Local Area Network).

<One Example of Etching Method>

Figure 2:
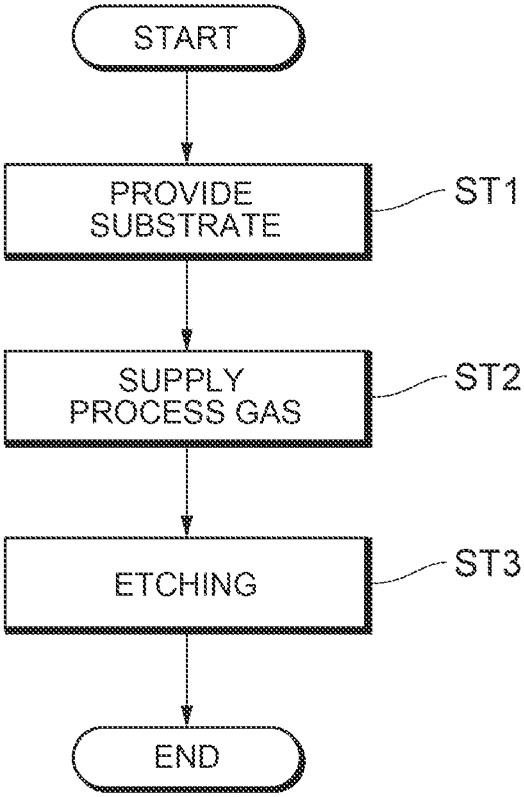
FIG. 2 is a flowchart illustrating an example of a processing method.

FIG. 2 is a flowchart illustrating an example of an etching method according to one exemplary embodiment (hereinafter also called "the present processing method"). As illustrated in FIG. 2, the present processing method includes process ST1 of providing the substrate, process ST2 of supplying a process gas, and process ST3 of etching the substrate. Processing in each process may be executed in the plasma processing system illustrated in FIG. 1. In the following, an example in which the controller 2 controls each element of the plasma processing apparatus 1 to execute the present processing method on the substrate W will be described.

(Process ST1: Providing of Substrate)

In process ST1, the substrate W is provided in the plasma processing space 10*s* of the plasma processing apparatus 1. The substrate W is provided in the central region 111*a* of the substrate support 11. Then, the substrate W is held by the electrostatic chuck 1111 in the substrate support 11.

Figure 3:
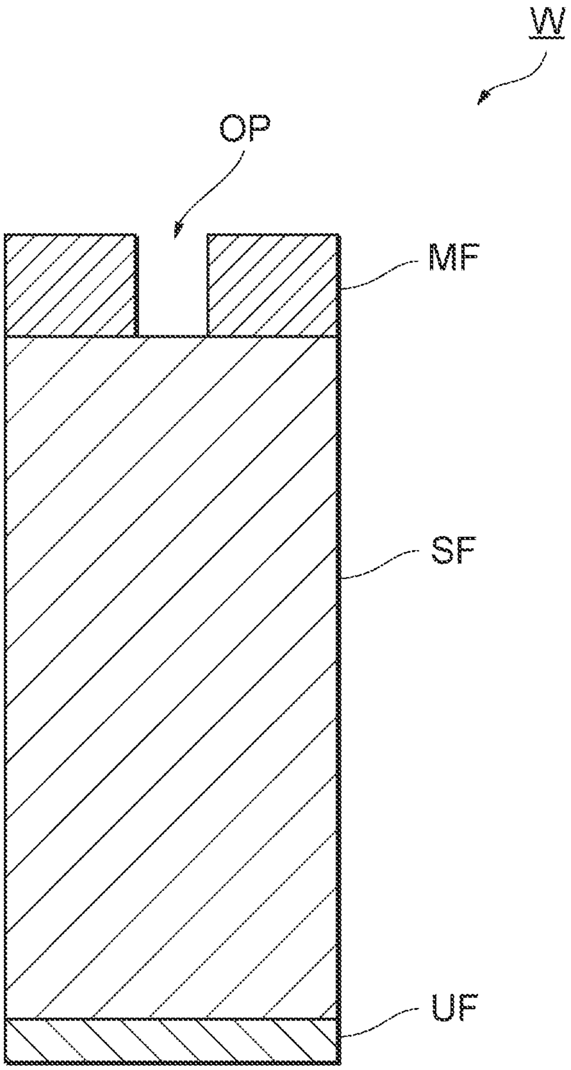
FIG. 3 is a diagram illustrating an example of the cross-sectional structure of a substrate W.

FIG. 3 is a diagram illustrating an example of the cross-sectional structure of the substrate W. The substrate W is so structured that a silicon-containing film SF and a mask MF are stacked on an underlying film UF in this order. The substrate W may be used in the manufacture of semiconductor devices. For example, the semiconductor devices include semiconductor memory devices such as a DRAM and a 3D-NAND flash memory.

In one example, the underlying film UF is a silicon wafer, or an organic film, a dielectric film, a metal film, a semiconductor film or the like formed on the silicon wafer. The underlying film UF may also be constructed by stacking plural films.

In the present processing method, the silicon-containing film SF is a film to be targeted for etching. The silicon-containing film SF is a film containing silicon and nitrogen. The film containing silicon and nitrogen may be a silicon nitride film or an SiON film. Further, the film containing silicon and nitrogen may be a film doped with impurities such as phosphorus, boron, or nitrogen in addition to silicon and nitrogen. The silicon-containing film SF may further contain any other silicon-containing film, such as a film containing silicon and oxygen, a film containing polycrystalline silicon, or a film containing silicon and carbon, in addition to the film containing silicon and nitrogen. The silicon-containing film SF may also be a film stack containing at least any one of the silicon nitride film, the silicon oxide film, and the polycrystalline silicon film. For example, the silicon-containing film SF may be a film stack constructed by alternately stacking silicon oxide films and silicon nitride films. Further, for example, the silicon-containing film SF may be a film stack containing the silicon nitride film, the silicon oxide film, and the polycrystalline silicon film. In this case, the silicon nitride film, the silicon oxide film, or the polycrystalline silicon film may be a film doped with impurities such as phosphorus, boron, or nitrogen.

The mask MF is a film that functions as a mask for etching of the silicon-containing film SF. The mask MF may be, for example, a carbon-containing film such as an amorphous carbon film, a photoresist film, or an SOC film. The mask MF may also be, for example, a silicon-containing film such as a silicon-containing anti-reflection film. The mask MF may further be, for example, a metal-containing film such as tungsten, titanium nitride, tungsten carbide, or tungsten silicide.

As illustrated in FIG. 3, the mask MF defines at least one opening OP on the silicon-containing film SF. The opening OP is a space on the silicon-containing film SF and is surrounded by side walls of the mask MF. In other words, the top surface of the silicon-containing film SF has an area covered with the mask MF and an area exposed at the bottom of the opening OP.

The opening OP may have any shape in a plan view of the substrate W, that is, when the substrate W is viewed from top to bottom in FIG. 3. For example, the shape may be a circular, oval, rectangular, or liner shape, or a shape that combines one or more of these shapes. The mask MF may have plural side walls, and the plural side walls may define plural openings OP. The plural openings OP may have linear shapes, respectively, and line up at regular intervals to configure a line and space pattern. Further, the plural openings OP may have hole shapes, respectively, to configure an array pattern.

Each of the films that constitute the substrate W (each of the underlying film UF, the silicon-containing film SF, and the mask MF) may be formed by CVD method, ALD method, or spin coating method, respectively. The opening OP may be formed by etching the mask MF. Further, the mask MF may be formed by lithography. Note that each film mentioned above may be a flat film or a film having an uneven structure. The substrate W may further have any other film under the underlying film UF so that a film stack of the silicon-containing film SF and the underlying film UF functions as a multilayer mask. In other words, the other film may be etched by using the film stack of the silicon-containing film SF and the underlying film UF as the multilayer mask.

Part of a process of forming each film of the substrate W may be performed in the space of the plasma processing chamber 10. In one example, a process of etching the mask MF to form the opening OP may be executed in the plasma processing chamber 10. In other words, forming of the opening OP and etching of the silicon-containing film SF to be described later may also be executed continuously in the same chamber. Further, the substrate may be provided by carrying the substrate W into the plasma processing space 10*s* of the plasma processing apparatus 1 after all or some of the respective films of the substrate W are formed in a device or a chamber outside of the plasma processing apparatus 1, and disposing the substrate W in the central region 111*a* of the substrate support 11.

After the substrate W is provided in the central region 111*a* of the substrate support 11, the temperature of the substrate support 11 is adjusted to a preset temperature by a temperature control module. The present temperature may be, for example, below 0° C., below −10° C., below −20° C., below −30° C., below −40° C., below −50° C., below −60° C., or below −70° C. In one example, adjusting or maintaining the temperature of the substrate support 11 includes adjusting or maintaining the temperature of a heat transfer fluid flowing through the flow paths 1110*a* to the preset temperature or a temperature different from the preset temperature. In one example, adjusting or maintaining the temperature of the substrate support 11 includes controlling the pressure of a heat transfer gas (for example, He) between the electrostatic chuck 1111 and the back surface of the substrate W. Note that timing to cause the heat transfer fluid to start flowing into the flow paths 1110*a* may be before or after the substrate W is placed on the substrate support 11, or may be at the same time. Further, in the present processing method, the temperature of the substrate support 11 may be adjusted to the preset temperature before process ST1. In other words, the substrate W may be provided on the substrate support 11 after the temperature of the substrate support 11 is adjusted to the preset temperature. In processes after process ST1, the temperature of the substrate support 11 may be maintained at the preset temperature after being adjusted in process ST1.

(Process ST2: Supply of Process Gas)

In process ST2, the process gas is supplied from the gas supply 20 into the plasma processing space 10*s*. The process gas contains a hydrogen fluoride (HF) gas and a chlorine-containing gas. In one embodiment, the process gas may further contain a phosphorus fluoride gas. In one embodiment, the process gas may not contain the phosphorus fluoride gas.

The flow rate of the HF gas may be the highest flow rate (partial pressure) in the process gas (excluding an inert gas when the process gas contains the inert gas). In one example, the flow rate of the HF gas may be 50 volume % or more, 60 volume % or more, or 70 volume % or more of the total flow of the process gas (the total flow of all gases excluding the inert gas when the process gas contains the inert gas), or may be 80 volume % or more of the total flow. As the HF gas, a highly pure gas such as a gas with a purity of 99.999% or more may be used.

The phosphorus fluoride gas is a gas containing fluorine and phosphorus, and in one example, it may be at least one selected from the group consisting of $PF_3$ gas, $PF_5$ gas, $POF_3$ gas, $HPF_2$ gas, $H_2PF_3$ gas, and $HPF_6$ gas.

The chlorine-containing gas may be, for example, at least one selected from the group consisting of $Cl_2$ gas, HCl gas, $SiCl_2$ gas, $BCl_3$ gas, and $PCl_3$ gas. Further, the chlorine-containing gas may be a gas containing chlorine and boron or phosphorus, which may be, for example, a boron chloride gas such as $BCl_3$ gas, or a phosphorus chloride gas such as $PCl_3$ gas. The flow rate of the chlorine-containing gas may be 1.5 volume % or more, or 2 volume % or more, of the total flow of the process gas (or the total flow of all gases excluding an inert gas when the process gas contains the inert gas).

In one embodiment, the chlorine-containing gas contains at least one selected from the group consisting of $Cl_2$ gas, HCl gas, $SiCl_2$ gas, and $BCl_3$ gas. In this case, the flow rate of the chlorine-containing gas may be 5 volume % or less, or 4 volume % or less, of the total flow of the process gas (or the total flow of all gases excluding an inert gas when the process gas contains the inert gas).

In one embodiment, the chlorine-containing gas contains a phosphorus chloride gas. The phosphorus chloride gas may be, for example, at least one selected from the group consisting of $PCl_3$ gas, $PCl_5$ gas, and $POCl_3$ gas. In this case, the flow rate of the chlorine-containing gas may be 20 volume % or less, 15 volume % or less, or 10 volume % or less of the total flow of the process gas (or the total flow of all gases excluding an inert gas when the process gas contains the inert gas).

In one embodiment, the chlorine-containing gas contains carbon. The chlorine-containing gas containing carbon may be, for example, a CxHyFzClw gas (where x and w are integers of 1 or larger, and y and z are integers of 0 or larger). The chlorine-containing gas containing carbon may be, for example, $CHCl_3$ gas or $CH_2Cl_2$ gas.

The process gas may further contain a carbon-containing gas. The carbon-containing gas may be, for example, either or both of a fluorocarbon gas and a hydrofluorocarbon gas. In one example, the fluorocarbon gas may be at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas. In one example, the hydrofluorocarbon gas may be at least one selected from the group consisting of $CHF_3$ gas, $CH_2F_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas. Further, the carbon-containing gas may be linear one having an unsaturated bond. The linear carbon-containing gas having an unsaturated bond may use at least one selected from the group, for example, consisting of $C_3F_6$ (hexafluoropropene) gas, $C_4F_8$ (octafluoro-1-butene or octafluoro-2-butene) gas, $C_3H_2F_4$ (1,3,3,3-tetrafluoropropene) gas, $C_4H_2F_6$ (trans-1,1,1,4,4,4-hexafluoro-2-butene) gas, $C_4F_8O$ gas, $CF_3COF$ (1,2,2,2-tetrafluoromethane-1-one) gas, $CHF_2COF$ (difluoroacetic acid fluoride) gas, and $COF_2$ (carbonyl fluoride) gas. Further, among the carbon-containing gases mentioned above, a gas with a carbon number of two or more may be used.

The process gas may further contain an oxygen-containing gas. The oxygen-containing gas may be, for example, at least one type of gas selected from a group composed of $O_2$, CO, $CO_2$, $H_2O$, and $H_2O_2$. In one example, the oxygen-containing gas may be an oxygen-containing gas excluding $H_2O$, that is, at least one type of gas selected from a group composed of $O_2$, CO, $CO_2$, and $H_2O_2$. The flow rate of the oxygen-containing gas may be adjusted according to the flow rate of the carbon-containing gas.

The process gas may further contain a metal-containing gas. The metal-containing gas may be, for example, a tungsten-containing gas. The tungsten-containing gas may be a gas containing tungsten and halogen, and in one example, the tungsten-containing gas is a $WF_aCl_b$ gas (where a and b are integers not smaller than 0 and not larger than 6, respectively, and the sum of a and b is not smaller than 2 and not larger than 6). The tungsten-containing gas may be, for example, a gas containing tungsten and fluorine, such as a tungsten difluoride ($WF_2$) gas, a tungsten tetrafluoride ($WF_4$) gas, a tungsten pentafluoride ($WF_5$) gas, or a tungsten hexafluoride ($WF_4$) gas, or may be a gas containing tungsten and chlorine, such as a tungsten dichloride ($WCl_2$) gas, a tungsten tetrachloride ($WCl_4$) gas, a tungsten pentachloride ($WCl_5$) gas, or a tungsten hexachloride ($WCl_6$) gas. The tungsten-containing gas may be at least either of the $WF_6$ gas and the $WCl_6$ gas. As the metal-containing gas, for example, at least either of a titanium-containing gas or a molybdenum-containing gas may be used instead of or in addition to the tungsten-containing gas.

The process gas may further contain an inert gas. In one example, the inert gas may be a noble gas such as Ar gas, He gas, or Kr gas, or a nitrogen gas.

The process gas may also contain a gas capable of generating active species of hydrogen fluoride in the plasma instead of or in addition to the HF gas. The active species of hydrogen fluoride contain at least any one of a hydrogen fluoride gas, radicals, and ions.

The gas capable of generating the active species of hydrogen fluoride is, for example, a hydrofluorocarbon gas. In the hydrofluorocarbon gas, the number of carbons may be 2 or more, 3 or more, or 4 or more. In one example, the hydrofluorocarbon gas is at least one selected from the group consisting of $CH_2F_2$ gas, $C_3H_2F_4$ gas, $C_3H_2F_8$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas. In one example, the hydrofluorocarbon gas is at least one selected from the group consisting of $CH_2F_2$ gas, $C_3H_2F_4$ gas, $C_3H_2F_6$ gas, and $C_4H_2F_6$ gas.

The gas capable of generating the active species of hydrogen fluoride contains, for example, a fluorine-containing gas and a hydrogen-containing gas. The fluorine-containing gas is, for example, a fluorocarbon gas. In one example, the fluorocarbon gas is at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas. Further, for example, the fluorine-containing gas may be $NF_3$ gas or $SF_6$ gas. In one example, the hydrogen-containing gas may be at least one selected from the group consisting of $H_2$ gas, $CH_4$ gas, and $NH_3$ gas.

(Process ST3: Etching)

In process ST3, the silicon-containing film SF is etched using the plasma generated from the process gas. First, the source RF signal is supplied to the lower electrode of the substrate support 11 and/or the upper electrode of the showerhead 13. Thus, an RF electric field is generated between the showerhead 13 and the substrate support 11, and the plasma is generated from the process gas in the plasma processing space 10*s*. At this time, a bias signal may be supplied to the lower electrode of the substrate support 11. In this case, a bias potential is generated between the plasma and the substrate W. Active species such as ions and radicals in the plasma are attracted to the substrate W, and hence the silicon-containing film SF is etched by the active species.

The bias signal supplied to the substrate support 11 may be a bias RF signal supplied from the second RF generator 31*b*. Further, the bias signal may be a bias DC signal supplied from the DC generator 32*a*. The source RF signal and the bias signal may be both continuous waves or pulse waves, or either one may be a continuous wave and the other may be a pulse wave. When both the source RF signal and the bias signal are pulse waves, periods of both pulse waves may be synchronized with each other. Further, a duty ratio of each pulse wave may be set accordingly, which may be, for example, not less than 1% and not more than 80%, or not less than 5% and not more than 50%. Note that the duty ratio is a ratio of a period in which high power or voltage in the cycle of the pulse wave occupies. Further, when the bias DC signal is used, the pulse wave may have a rectangular, trapezoidal, or triangular waveform, or a combination of these waveforms. The polarity of the bias DC signal may be negative or positive if the potential of the substrate W is so set as to give a potential difference between the plasma and the substrate in a manner to attract ions.

Figure 4:
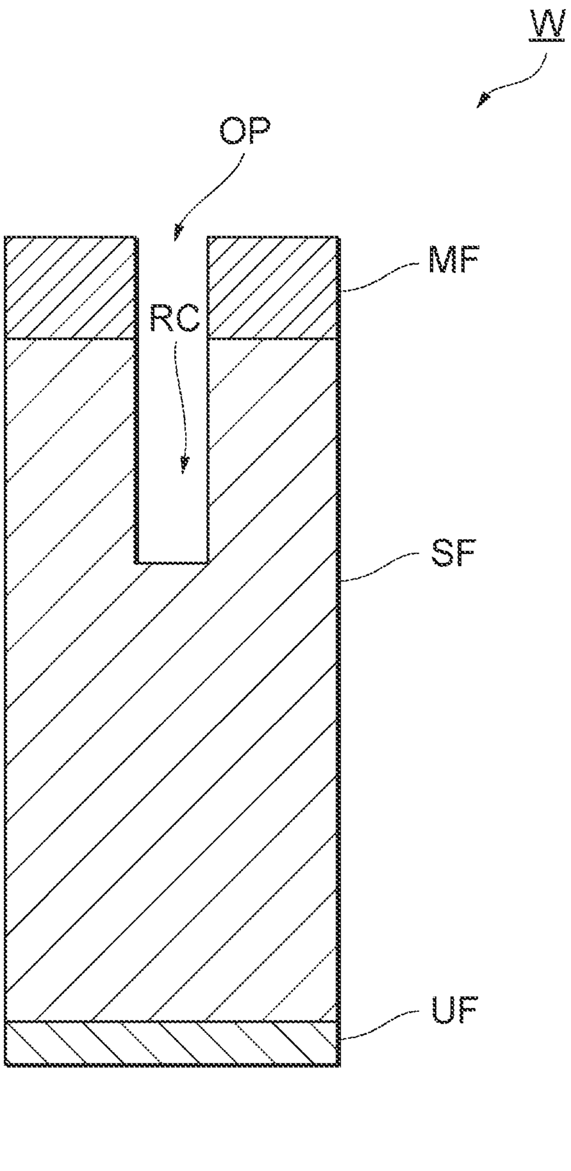
FIG. 4 is a diagram illustrating an example of the cross-sectional structure of the substrate W being processed in process ST3.

FIG. 4 is a diagram illustrating an example of the cross-sectional structure of the substrate W being processed in process ST3. As illustrated in FIG. 4, a part of the silicon-containing film SF exposed in the opening OP is etched in a depth direction (in a direction from top to bottom in FIG. 4) by treatment in process ST3 to form a recess RC. The aspect ratio of the recess RC in a state where the recess RC reaches the underlying film UF may be, for example, 20 or more, 30 or more, 40 or more, 50 or more, or 100 or more.

In one embodiment, process conditions may be changed in process ST3. For example, changing the process conditions includes changing the partial pressure of the chlorine-containing gas during process ST3. In other words, after the partial pressure of the chlorine-containing gas is set to a first partial pressure to etch the silicon-containing film SF in process ST3, the partial pressure of the chlorine-containing gas may be changed to a second partial pressure different from the first partial pressure to further etch the silicon-containing film SF.

When the process gas contains a phosphorus fluoride gas, changing the process conditions includes, for example, changing the partial pressure of the phosphorus fluoride gas during process ST3. In other words, after the partial pressure of the phosphorus fluoride gas is set to a third partial pressure to etch the silicon-containing film SF in process ST3, the partial pressure of the phosphorus fluoride gas may be changed to a fourth partial pressure different from the third partial pressure to further etch the silicon-containing film SF.

Changing the process conditions includes, for example, changing the type of the chlorine-containing gas during process ST3. In other words, after a plasma is generated from a hydrogen fluoride gas and a first chlorine-containing gas to etch the silicon-containing film in process ST3, the plasma may be generated from the hydrogen fluoride gas and a second chlorine-containing gas different from the first chlorine-containing gas to etch the silicon-containing film. In one example, the first chlorine-containing gas may be $Cl_2$ gas, and the second chlorine-containing gas may be any chlorine-containing gas other than $Cl_2$ gas such as $BCl_3$ gas.

The process conditions (the partial pressure of the chlorine-containing gas/the partial pressure of the phosphorus fluoride gas/the type of the chlorine-containing gas, and the like) may be changed, for example, according to the aspect ratio of the recess RC formed by process ST3, the depth of the recess RC, the processing time of process ST3, and the like. Further, the process conditions may be changed based on data, such as data indicative of the shape of a previously acquired recess RC, or data indicative of the shape of the recess RC estimated from the plasma emission intensity and the like.

As described above, the shape of the recess can be controlled more appropriately by changing the process conditions during process ST3.

In the present processing method, the process gas contains HF gas. Hydrogen fluoride in the plasma generated from the process gas functions as an etchant for the silicon-containing film SF. When the process gas contains a phosphorus fluoride gas, phosphorus derived from the phosphorus fluoride gas can promote the absorption of hydrogen fluoride at the bottom of the recess RC. Thus, the etching rate of the silicon-containing film SF can be improved.

Here, when hydrogen (H) and fluorine (F) derived from the HF gas or the phosphorus fluoride gas increase in the plasma, etching can be accelerated but reaction by-products can also be increased. The reaction by-products can contain ammonium silicofluoride $(NH_4)_2SiF_6$ (hereinafter called "AFS") generated by reaction between silicon nitride (SiN) and hydrogen fluoride in the silicon-containing film SF. The AFS is difficult to volatilize, which can adhere to the recess RC and the like of the silicon-containing film SF to cause etching shape abnormality. As such shape abnormality, a tapered bottom of the recess RC, bending and twisting of the recess RC, and the like can be included.

In the present processing method, the process gas contains the chlorine-containing gas. Chlorine in the plasma reacts with the AFS to generate highly volatile $SiF_4$ or the like so as to break down the AFS. In other words, chlorine in the plasma can reduce the amount of AFS adhering to the recess RC and the like in order to suppress etching shape abnormality. On the other hand, when chlorine in the plasma is excessive, the mask MF is etched to make it difficult to ensure a sufficient selection ratio for the mask MF. Further, when chlorine in the plasma is excessive, the partial pressure of hydrogen fluoride or phosphorus in the plasma can drop to reduce the etching rate of the silicon-containing film SF.

In the present processing method, the flow rate of the chlorine-containing gas is 1.5 volume % or more of the total flow of the process gas (or the total flow of all gases excluding an inert gas when the process gas contains the inert gas). When the flow rate of the chlorine-containing gas is 1.5 volume % or more, the effect of suppression of the shape abnormality of the recess RC described above can be obtained. Further, in a case where the chlorine-containing gas contains a phosphorus chloride gas (for example, $PCl_3$ gas, $PCl_3$ gas, $POCl_3$ gas, or the like), when the flow rate of the chlorine-containing gas is 20 volume % or less, there is no decrease in the etching rate and the selection ratio described above, or the decreases are limited. In a case where the chlorine-containing gas does not contain phosphorus (such as $Cl_2$ gas, HCl gas, $SiCl_2$ gas, and $BCl_3$ gas), when the flow rate of the chlorine-containing gas is 5 volume % or less, there is no decrease in the etching rate and the selection ratio described above, or the decreases are limited.

According to the present processing method, the shape abnormality of the recess formed in the silicon-containing film can be suppressed while suppressing the decreases in the etching rate and the selection ratio of the silicon-containing film.

EXAMPLES

Next, Examples of the present processing method will be described. However, this disclosure is not limited by Examples.

Examples 1 and 2

In Examples 1 and 2, the present processing method using the plasma processing apparatus 1 was applied to etch a substrate similar in structure to the substrate W illustrated in FIG. 3. An amorphous carbon film was used as the mask MF. As the silicon-containing film SF, a film stack constructed by alternately stacking silicon nitride films and silicon oxide films was used. The process gas used in process ST2 contained HF gas, $PF_3$ gas, and $BCl_3$ gas. In Example 1, the process gas contained 1.8 volume % of $BCl_3$ gas with respect to the total flow of the process gas. In Example 2, the process gas contained 2.7 volume % of $BCl_3$ gas with respect to the total flow of the process gas. During etching, the temperature of the substrate support 11 was set to −70° C.

Reference Example 1

In Reference Example 1, the substrate having the same structure as those in Examples 1 and 2 was etched by using the plasma processing apparatus 1. In Reference Example 1, etching was performed under the same conditions as those in Example 1 and Example 2 except that the process gas did not contain $BCl_3$ gas.

Figure 5:
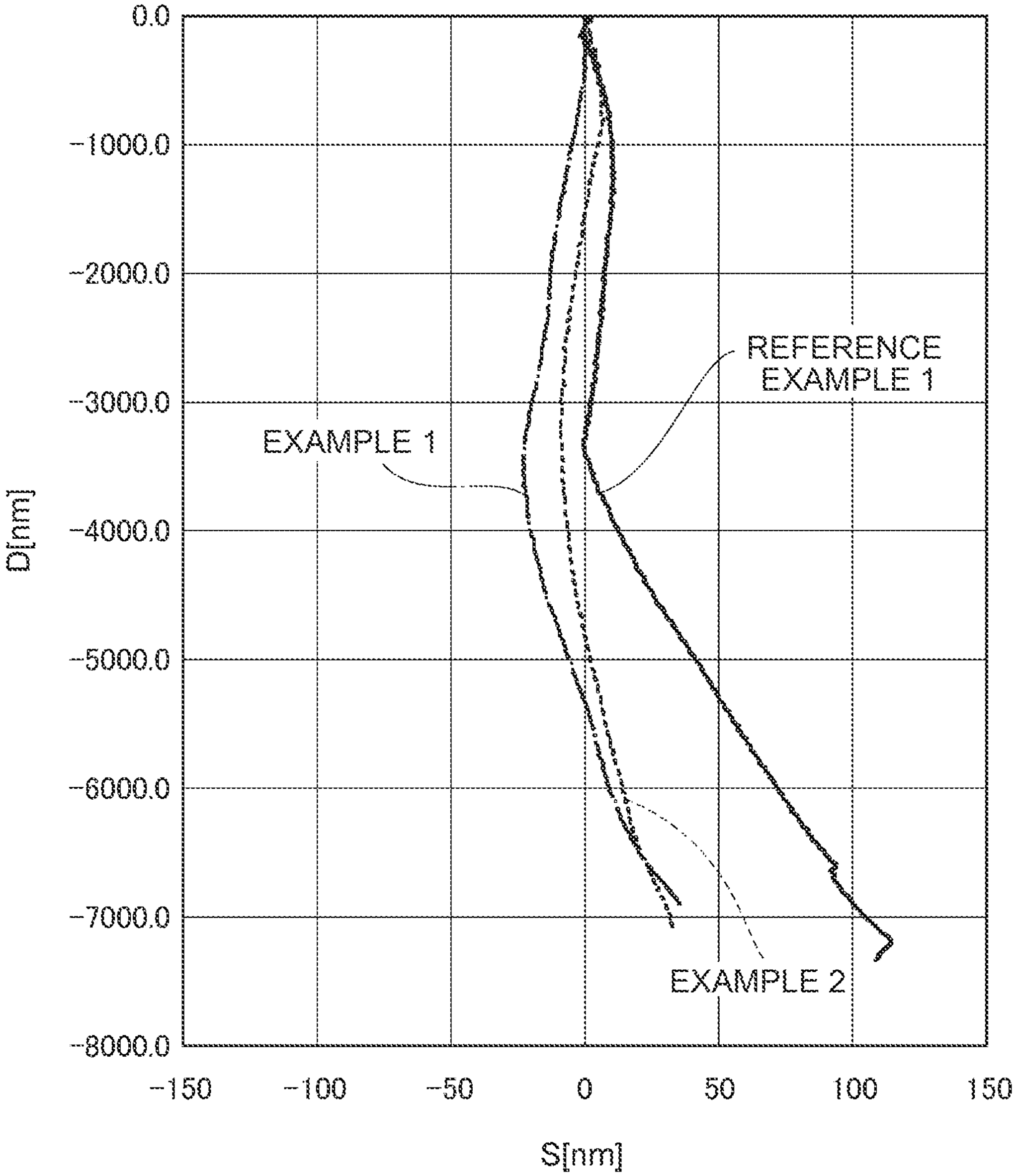
FIG. 5 is a chart illustrating etching results according to examples and a reference example.

FIG. 5 is a chart illustrating etching results according to Examples and Reference Example. In FIG. 5, the vertical axis indicates the depth D [nm] of the recess formed in the silicon-containing film SF. The horizontal axis indicates the amount of deviation S [nm] of the recess RC. The amount of deviation S is a distance between the midpoint of the width of the recess RC at a certain depth and a center reference line (a line through the midpoint of the width of the recess RC at a depth of zero). When bending and twisting of the recess RC formed in the silicon-containing film SF increase, the amount of deviation S increases.

As illustrated in FIG. 5, even when the depth of the recess increased in Example 1 and Example 2, the amount of deviation S was greatly reduced compared to Reference Example 1. In other words, the shapes of the recess formed by Example 1 and Example 2 were much better than that in Reference Example 1. Further, the etching rates in Example 1 and Example 2 were decreased compared to that in Reference Example 1, but the etching rates were 92% and 81% of the etching rate in Reference Example 1, and kept enough values, respectively. The selection ratios in Example 1 and Example 2 were also decreased compared to that in Reference Example 1, but the selection ratios were 81% and 71% of the selection ratio in Reference Example 1, and the mask MF after etched kept enough thickness, respectively.

As described above, etching of the silicon-containing film SF in Example 1 and Example 2 was able to suppress the decreases in the etching rate and the selection ratio while significantly suppressing etching shape abnormality compared to that in Reference Example 1.

Example 3

In Example 3, the present processing method using the plasma processing apparatus 1 was applied to etch a substrate similar in structure to the substrate W illustrated in FIG. 3. The amorphous carbon film was used as the mask MF. As the silicon-containing film SF, the film stack constructed by alternately stacking silicon nitride films and silicon oxide films was used. The process gas used in process ST2 contained HF gas, $PCl_3$ gas, and Ar gas. $PCl_3$ gas was contained by 10% of the total flow of the process gas excluding the inert gas. During etching, the temperature of the substrate support 11 was set to −70° C.

Reference Example 2

In Reference Example 2, the substrate having the same structure as those in Examples 1 and 2 was etched by using the plasma processing apparatus 1. In Reference Example 2, etching was performed under the same conditions as those in Example 3 except that the process gas contained $PF_3$ gas instead of $PCl_3$ gas. $PF_3$ gas was contained by 10% of the total flow of the process gas excluding the inert gas.

Figure 6:
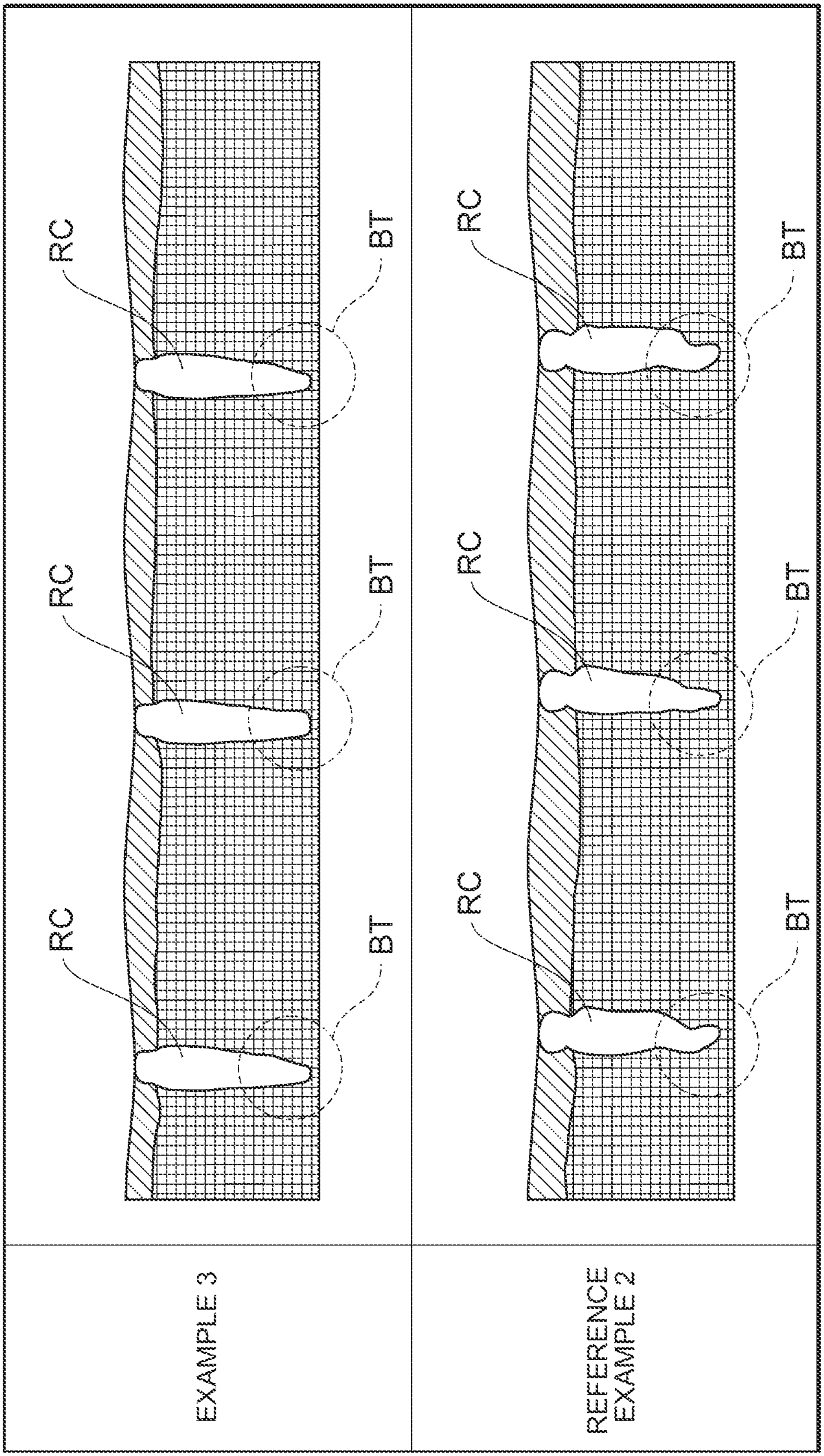
FIG. 6 is a diagram illustrating etching results according to an example and a reference Example.

FIG. 6 is a diagram illustrating etching results according to Example and Reference Example. FIG. 6 illustrates the shape of each recess RC after etched in Example 3 and Reference Example 2. In Reference Example 2, twisting occurred at the bottom BT of the recess RC. On the other hand, no twisting occurred at the bottom BT of the recess RC in Example 3. In other words, Example 3 was able to suppress etching shape abnormality compared to Reference Example 2.

According to one exemplary embodiment of this disclosure, there can be provided a technique for suppressing etching shape abnormality.

The embodiments of this disclosure further include the following aspects.

(Addendum 1)

An etching method executed in a plasma processing apparatus having a chamber, including:

(a) providing, on a substrate support in a chamber, a substrate having a silicon-containing film including a silicon nitride film, and a mask on the silicon-containing film;

(b) supplying, into the chamber, a process gas containing a hydrogen fluoride gas, a phosphorus fluoride gas, and a chlorine-containing gas, where the flow rate of the chlorine-containing gas is not less than 1.5 volume % and not more than 5 volume % of the total flow of the process gas excluding an inert gas; and (c) generating a plasma from the process gas to etch the silicon-containing film.

(Addendum 2)

The etching method according to Addendum 1, wherein the chlorine-containing gas is at least one selected from the group consisting of $Cl_2$ gas, HCl gas, $SiCl_2$ gas, $BCl_3$ gas, and $PCl_3$ gas.

(Addendum 3)

The etching method according to Addendum 1, wherein the chlorine-containing gas is a gas containing chlorine and boron or phosphorus.

(Addendum 4)

The etching method according to any one of Addendum 1 to Addendum 3, wherein the phosphorus fluoride gas is at least either one of $PF_3$ gas and $PF_5$ gas.

(Addendum 5)

The etching method according to any one of Addendum 1 to Addendum 4, wherein the flow rate of the hydrogen fluoride gas is highest in the process gas excluding the inert gas.

(Addendum 6)

The etching method according to any one of Addendum 1 to Addendum 5, wherein the process gas further contains a carbon-containing gas.

(Addendum 7)

The etching method according to Addendum 6, wherein the carbon-containing gas is either a fluorocarbon gas or a hydrofluorocarbon gas.

(Addendum 8)

The etching method according to Addendum 7, wherein the number of carbons in the carbon-containing gas is 2 or more.

(Addendum 9)

The etching method according to any one of Addendum 1 to Addendum 8, wherein the process gas further contains at least either one of an oxygen-containing gas and a metal-containing gas.

(Addendum 10)

The etching method according to Addendum 9, wherein the oxygen-containing gas contains at least one type of gas selected from a group composed of $O_2$, CO, $CO_2$, $H_2O$, and $H_2O_2$.

(Addendum 11)

The etching method according to Addendum 9, wherein the metal-containing gas contains at least one type of gas selected from a group composed of a tungsten-containing gas and a titanium-containing gas or a molybdenum-containing gas.

(Addendum 12)

The etching method according to any one of Addendum 1 to Addendum 11, wherein the process gas further contains an inert gas.

(Addendum 13)

The etching method according to any one of Addendum 1 to Addendum 12, wherein the silicon-containing film further contains at least either one of a silicon oxide film and a polysilicon film.

(Addendum 14)

The etching method according to any one of Addendum 1 to Addendum 13, wherein the mask is a carbon-containing film or a metal-containing film.

(Addendum 15)

The etching method according to any one of Addendum 1 to Addendum 14, wherein the temperature of the substrate support is set to 0° C. or less in (c).

(Addendum 16)

An etching method executed in a plasma processing apparatus having a chamber, including:

(a) providing, on a substrate support in a chamber, a substrate having a silicon-containing film including at least a silicon nitride film, and a mask on the silicon-containing film;

(b) supplying, into the chamber, a process gas containing at least a phosphorus fluoride gas and a chlorine-containing gas, where the flow rate of the chlorine-containing gas is not less than 1.5 volume % and not more than 5 volume % of the total flow of the process gas excluding an inert gas; and (c) generating a plasma from the process gas to etch the silicon-containing film, where the plasma contains active species of hydrogen fluoride.

(Addendum 17)

The etching method according to Addendum 16, wherein the active species of hydrogen fluoride are generated from at least one type of gas of a hydrogen fluoride gas or a hydrofluorocarbon gas in the process gas.

(Addendum 18)

The etching method according to Addendum 16, wherein the active species of hydrogen fluoride are generated from a hydrofluorocarbon gas with a carbon number of 2 or more in the process gas.

(Addendum 19)

The etching method according to Addendum 16, wherein the active species of hydrogen fluoride are generated from a fluorine-containing gas and a hydrogen-containing gas in the process gas.

(Addendum 20)

A plasma processing system including a chamber, a substrate support disposed in the chamber, a plasma generator, and a controller, wherein the controller is configured to cause:

(a) placing, on the substrate support in the chamber, a substrate having a silicon-containing film including at least a silicon nitride film, and a mask on the silicon-containing film;

(b) supplying, into the chamber, a process gas containing a hydrogen fluoride gas, a phosphorus fluoride gas, and a chlorine-containing gas, where the flow rate of the chlorine-containing gas is not less than 1.5 volume % and not more than 5 volume % of the total flow of the process gas excluding an inert gas; and (c) generating a plasma from the process gas to etch the silicon-containing film.

(Addendum 21)

A device manufacturing method executed in a plasma processing apparatus having a chamber, including:

(a) providing, on a substrate support in the chamber, a substrate having a silicon-containing film including a silicon nitride film, and a mask on the silicon-containing film;

(b) supplying, into the chamber, a process gas containing a hydrogen fluoride gas, a phosphorus fluoride gas, and a chlorine-containing gas, where the flow rate of the chlorine-containing gas is not less than 1.5 volume % and not more than 5 volume % of the total flow of the process gas excluding an inert gas; and (c) generating a plasma from the process gas to etch the silicon-containing film.

(Addendum 22)

A program causing a computer in a plasma processing system including a chamber, a substrate support disposed in the chamber, and a plasma generator to execute:

(a) placing, on the substrate support in the chamber, a substrate having a silicon-containing film including at least a silicon nitride film, and a mask on the silicon-containing film;

(b) supplying, into the chamber, a process gas containing a hydrogen fluoride gas, a phosphorus fluoride gas, and a chlorine-containing gas, where the flow rate of the chlorine-containing gas is not less than 1.5 volume % and not more than 5 volume % of the total flow of the process gas excluding an inert gas; and (c) generating a plasma from the process gas to etch the silicon-containing film.

(Addendum 23)

A storage medium on which the program according to Addendum 22 is stored.

(Addendum 24)

An etching method including:

(a) providing, on a substrate support in a chamber, a substrate having a silicon-containing film including silicon and nitrogen, and a mask on the silicon-containing film;

(b) supplying, into the chamber, a process gas containing a hydrogen fluoride gas and a chlorine-containing gas, where the flow rate of the chlorine-containing gas is 1.5 volume % or more of the total flow of the process gas excluding an inert gas; and (c) generating a plasma from the process gas to etch the silicon-containing film.

(Addendum 25)

The etching method according to Addendum 24. (c) further including:

setting the partial pressure of the chlorine-containing gas to a first partial pressure to etch the silicon-containing film: and setting the partial pressure of the chlorine-containing gas to a second partial pressure different from the first partial pressure to etch the silicon-containing film.

(Addendum 26)

The etching method according to Addendum 24 or Addendum 25, wherein the process gas further contains a phosphorus fluoride gas.

(Addendum 27)

The etching method according to Addendum 26, (c) further including:

setting the partial pressure of the phosphorus fluoride gas to a third partial pressure to etch the silicon-containing film; and setting the partial pressure of the phosphorus fluoride gas to a fourth partial pressure different from the third partial pressure to etch the silicon-containing film.

(Addendum 28)

The etching method according to any one of Addendum 24 to Addendum 27, (c) further including:

generating a plasma from the hydrogen fluoride gas and a first chlorine-containing gas to etch the silicon-containing film; and generating a plasma from the hydrogen fluoride gas and a second chlorine-containing gas different from the first chlorine-containing gas to etch the silicon-containing film.

Various modifications can be made to the embodiments of this disclosure without departing from the scope and sprit of this disclosure. The present processing method may also be executed by using a plasma processing apparatus with any plasma source other than that in the capacitive coupling type plasma processing apparatus 1, such as a plasma processing apparatus using an inductively coupled plasma or a microwave plasma.

What is claimed is:

1. An etching method comprising:

(a) providing a substrate on a substrate support in a chamber, the substrate including a silicon-containing film and a mask on the silicon-containing film, the silicon-containing film including silicon and nitrogen;

(b) supplying a process gas to the chamber, the process gas containing a hydrogen fluoride gas and a chlorine-containing gas that contains carbon and hydrogen, where a flow rate of the chlorine-containing gas is 1.5 volume % or more and 5 volume % or less of a total flow of the process gas excluding an inert gas; and (c) generating a plasma from the process gas to etch the silicon-containing film.

2. The etching method according to claim 1, wherein the process gas further contains a phosphorus fluoride gas.

3. The etching method according to claim 2, wherein the phosphorus fluoride gas is at least either one of $PF_3$ gas and $PF_5$ gas.

4. The etching method according to claim 1, wherein the chlorine-containing gas contains a CxHyFzClw gas (where x and w are integers of 1 or larger, and y and z are integers of 0 or larger).

5. The etching method according to claim 1, wherein the process gas further contains a phosphorus-containing gas.

6. The etching method according to claim 1, wherein the flow rate of the hydrogen fluoride gas is higher than a flow rate of any other gas in the process gas excluding the inert gas.

7. The etching method according to claim 1, wherein the process gas further contains a carbon-containing gas.

8. The etching method according to claim 7, wherein the carbon-containing gas is either a fluorocarbon gas or a hydrofluorocarbon gas.

9. The etching method according to claim 7, wherein the process gas further contains at least either one of an oxygen-containing gas and a metal-containing gas.

10. The etching method according to claim 1, wherein the silicon-containing film further contains at least any one of a silicon nitride film, a silicon oxide film, and a polysilicon film.

11. The etching method according to claim 1, wherein the mask is a carbon-containing film or a metal-containing film.

12. The etching method according to claim 1, wherein a temperature of the substrate support is set to 0° C. or less in (c).

13. The etching method according to claim 1, wherein the chlorine-containing gas is $CHCl_3$ gas or $CH_2Cl_2$ gas.

14. An etching method comprising:

(a) providing a substrate on a substrate support in a chamber, the substrate including a silicon-containing film and a mask on the silicon-containing film, the silicon-containing film including silicon and nitrogen;

(b) supplying a process gas to the chamber, the process gas containing a single or mixed gas and a chlorine-containing gas that contains carbon and hydrogen, the single or mixed gas containing fluorine and hydrogen, where a flow rate of the chlorine-containing gas is 1.5 volume % or more and 5 volume % or less of a total flow of the process gas excluding an inert gas; and (c) generating a plasma from the process gas to etch the silicon-containing film, where the plasma contains active species of hydrogen fluoride.

15. The etching method according to claim 14, wherein the single or mixed gas is at least one selected from the group consisting of a hydrogen fluoride gas, a hydrofluorocarbon gas, and a mixed gas containing a fluorine-containing gas and a hydrogen-containing gas.

* * * * *